United States Patent
Jia et al.

(10) Patent No.: US 12,219,794 B2
(45) Date of Patent: Feb. 4, 2025

(54) DISPLAY SUBSTRATE WITH HOLE-FORMING AREAS, MANUFACTURING METHOD THEREOF, AND DISPLAY DEVICE INCLUDING THE DISPLAY SUBSTRATE

(71) Applicants: Chengdu BOE Optoelectronics Technology Co., Ltd., Sichuan (CN); BOE Technology Group Co., Ltd., Beijing (CN)

(72) Inventors: Li Jia, Beijing (CN); Tao Gao, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 122 days.

(21) Appl. No.: 17/425,114

(22) PCT Filed: Jan. 4, 2021

(86) PCT No.: PCT/CN2021/070132
§ 371 (c)(1),
(2) Date: Jul. 22, 2021

(87) PCT Pub. No.: WO2021/143558
PCT Pub. Date: Jul. 22, 2021

(65) Prior Publication Data
US 2022/0344612 A1    Oct. 27, 2022

(30) Foreign Application Priority Data
Jan. 17, 2020   (CN) .......................... 202010051525.3

(51) Int. Cl.
*H10K 50/842*    (2023.01)
*H10K 59/12*    (2023.01)
(Continued)

(52) U.S. Cl.
CPC ....... *H10K 50/8428* (2023.02); *H10K 59/131* (2023.02); *H10K 71/00* (2023.02); *H10K 77/111* (2023.02); *H10K 59/1201* (2023.02)

(58) Field of Classification Search
CPC .......................... H10K 50/8428; H10K 77/111
See application file for complete search history.

(56) References Cited

U.S. PATENT DOCUMENTS

2017/0148856 A1    5/2017  Choi et al.
2018/0052493 A1*   2/2018  Hong ..................... G06F 1/1626
(Continued)

FOREIGN PATENT DOCUMENTS

CN       109935730 A    6/2019
CN       110112317 A    8/2019
(Continued)

OTHER PUBLICATIONS

CN 2020100515253 first office action.
PCT/CN2021/070132 international search report and written opinion.

*Primary Examiner* — Thao X Le
*Assistant Examiner* — Bruce R. Smith
(74) *Attorney, Agent, or Firm* — IPro, PLLC

(57) ABSTRACT

A display substrate, a method manufacturing thereof and a display device are provided, including a base film layer, a functional film layer and a partial display region with hole-forming areas dividing an island area for displaying and a bridge area for signal transmission. The display substrate further includes a separation structure on the base film layer in the bridge area, which separates a target functional film layer into first and second parts. The target function film layer includes any functional film layer formed at a side of the separation structure away from the base film layer, the first part includes a part of the target functional film layer located at a side of the separation structure away (Continued)

from the hole-forming area, and the second part includes a part of the target functional film layer located at a side of the separation structure near the hole-forming area.

19 Claims, 8 Drawing Sheets

(51) Int. Cl.
*H10K 59/131* (2023.01)
*H10K 71/00* (2023.01)
*H10K 77/10* (2023.01)

(56) References Cited

U.S. PATENT DOCUMENTS

| | | |
|---|---|---|
| 2019/0296097 A1 | 9/2019 | Hong et al. |
| 2020/0006700 A1 | 1/2020 | Kim et al. |
| 2020/0350266 A1 | 11/2020 | Zhang et al. |
| 2021/0066426 A1* | 3/2021 | Chen ................ H10K 59/65 |
| 2021/0257421 A1 | 8/2021 | Liu et al. |
| 2021/0257434 A1 | 8/2021 | Xie et al. |
| 2021/0408499 A1* | 12/2021 | Li .................... H04N 23/57 |

FOREIGN PATENT DOCUMENTS

| | | | | |
|---|---|---|---|---|
| CN | 110211968 A | | 9/2019 | |
| CN | 110649177 A | * | 1/2020 | ......... H01L 27/3244 |
| CN | 111244322 A | | 6/2020 | |
| IN | 110571248 A | | 12/2019 | |

* cited by examiner

DISPLAY SUBSTRATE WITH HOLE-FORMING AREAS, MANUFACTURING METHOD THEREOF, AND DISPLAY DEVICE INCLUDING THE DISPLAY SUBSTRATE

CROSS-REFERENCE TO RELATED APPLICATION

The present application is the U.S. national phase of PCT Application No. PCT/CN2021/070132 filed on Jan. 4, 2021, which claims the priority of Chinese patent application No. 202010051525.3, filed on Jan. 17, 2020, which is incorporated herein by reference in its entirety.

TECHNICAL FIELD

The present disclosure relates to the field of display technology, and in particular, to a display substrate, a manufacturing method thereof, and a display device.

BACKGROUND

With the development of display technologies, organic light-emitting diodes (referred to as OLEDs) that can perform flexible displays have promoted diversification of displays and have gradually become the mainstream of display technologies. In some related technologies, OLED flexible display devices can meet bending of a two-dimensional surface, but are not suitable for display devices with more complicated situations (for example, wearable devices, etc.) for flexibility requirements of display substrates.

In order to develop a stretchable OLED display function, in some related technologies, holes are defined in a substrate of an OLED flexible display device to form islands for preparing pixel areas and bridges for wiring, and stretching of the display device is realized though deformation of the bridges. However, due to the holes defined in the substrate, water and oxygen will enter functional film layers from the holes, which will affect normal display of the display device.

SUMMARY

In a first aspect, one embodiment of the present disclosure provides a display substrate, including a base film layer, a functional film layer, and a partial display region; wherein the partial display region includes a plurality of hole-forming areas, an island area for displaying and a bridge area for signal transmission, the island area and the bridge area are divided by the plurality of hole-forming areas; the plurality of hole-forming areas are arranged around the island area, a part of the bridge area is located between the island area and the hole-forming area and the other part of the bridge area is located between the hole-forming areas; the display substrate further includes a separation structure located in the bridge area;

the separation structure is located on the base film layer and separates a target functional film layer to form a first part and a second part, and the target function film layer includes any functional film layer formed at a side of the separation structure away from the base film layer, the first part includes a part of the target functional film layer that is located at a side of the separation structure away from the hole-forming area, and the second part includes a part of the target functional film layer that is located at a side of the separation structure near the hole-forming area.

Further, each separation structure is a closed structure with a head thereof being connected to an end thereof; and the separation structure is arranged around the hole-forming area.

Further, there are N separation structures that are arranged around the same hole-forming area, and N is equal to 1, 2 or 3.

Further, the bridge area includes first-layer signal traces, a first planarization layer and second-layer signal traces that are sequentially arranged in a direction away from the base film layer; and the first planarization layer is located between the first-layer signal traces and the second-layer signal traces; and the number of the second-layer signal traces is not greater than the number of first-layer signal traces.

Further, the separation structure is located at a side of the first-layer signal traces away from the base film layer.

Further, the separation structure in the bridge area is located on the first planarization layer and between the second-layer signal traces and the hole-forming area, and the number of the first-layer signal traces is greater than the number of the second-layer signal traces.

Further, the separation structure includes a separation column; the separation column includes a first structure and a second structure arranged in a direction perpendicular to the base film layer; the first structure is located between the second structure and the base film layer; an orthographic projection of the first structure onto the base film layer is located inside an orthographic projection of the second structure onto the base film layer.

Further, the separation column and the second-layer signal traces are made of the same material.

Further, the bridge area further includes a second planarization layer covering the second-layer signal traces; the separation structure is located at a side of the second-layer signal traces away from the base film layer; and the number of the first-layer signal traces is equal to the number of the second-layer signal traces.

Further, the bridge area further includes a passivation layer arranged on the second planarization layer; the separation structure includes an separation groove that extends through the passivation layer and a part of the second planarization layer; and an orthographic projection of an opening of the separation groove onto the base film layer is located inside an orthographic projection of the separation groove onto the base film layer.

Further, an orthographic projection of the second-layer signal traces onto the base film layer does not coincide with the orthographic projection of the opening onto the base film layer.

Further, an orthographic projection of one separation groove onto the base film layer partially overlaps each of two orthographic projections of two adjacent second-layer signal traces onto the base film layer.

Further, the display substrate is a rectangular display substrate, and there are four partial display regions at four corner regions of the rectangular display substrate.

Further, each hole-forming area has a shape of "H", and includes a first opening portion and two second opening portions at two sides of the first opening portion and communicating with the first opening portion; in the plurality of hole-forming areas surrounding the same island area, the first hole forming portions in two adjacent hole-forming areas are perpendicular to each other.

Further, in each hole-forming area, the second opening portion is perpendicular to the first opening portion.

Further, between the two second opening portions in each hole-forming area, there are two island areas arranged at intervals along an extension direction of the first opening portion.

In a second aspect, one embodiment of the present disclosure further provides a display device which includes the foregoing display substrate.

In a third aspect, one embodiment of the present disclosure further provides a method of manufacturing a display substrate, which includes:

providing a flexible base film layer, wherein the flexible base film layer includes a plurality of hole-forming areas defined in a partial display region, and the plurality of hole-forming areas divide an island area for displaying and a bridge area for signal transmission, the plurality of hole-forming areas are arranged around the island area, a part of the bridge area is located between the island area and the hole-forming area and the other part of the bridge area is located between the hole-forming areas;

forming a separation structure on the flexible base film layer, wherein the separation structure is located in the bridge area;

forming a target functional film layer covering the separation structure, wherein the separation structure separates the target functional film layer to form a first part and a second part that are separated with each other, the first part includes a part of the target functional film layer that is located at a side of the separation structure away from the hole-forming area, and the second part includes a part of the target functional film layer that is located at a side of the separation structure near the hole-forming area.

Further, the step of forming the separation structure on the flexible base film layer, includes:

forming first-layer signal traces on the flexible base film layer and a planarization layer covering the first-layer signal traces;

simultaneously forming a first metal pattern and a second metal pattern in the bridge area on the first planarization layer, wherein the second metal pattern is located between the first metal pattern and the hole-forming area, each of the first metal pattern and the second metal pattern includes a first metal layer and a second metal layer arranged in a direction perpendicular to the flexible base film layer, and the first metal layer is located between the second metal layer and the flexible base film layer;

forming an anode material layer on the flexible base film layer;

etching the second metal pattern to form an separation column while etching the anode material layer to obtain an anode, wherein an etching speed of the first metal layer is greater than an etching speed of the second metal layer.

Further, the step of etching the second metal pattern to form a separation column while etching the anode material layer to obtain an anode, includes:

when etching the anode material layer in the island area with a first etching solution to obtain an anode, etching a part of the anode material layer covering the second metal pattern with a part of the anode material layer covering the first metal pattern being reserved;

etching the second metal pattern with a second etching solution to form the separation structure.

Further, the step of forming the separation structure on the flexible base film layer, includes:

sequentially forming first-layer signal traces, a first planarization layer covering the first-layer signal traces, second-layer signal traces, a second planarization layer covering the second-layer signal traces and a passivation layer on the flexible base film layer;

etching the passivation layer to form a via-hole that extends through the passivation layer in the bridge area;

taking an etched passivation layer as a mask, etching a part of the second planarization layer to form a groove in the second planarization layer in the bridge area, so that the via-hole and the groove together form an separation groove, and an orthographic projection of an opening of the separation groove onto the flexible base film layer is located inside an orthographic projection of the separation groove onto the flexible base film layer.

BRIEF DESCRIPTION OF THE DRAWINGS

To better clarify technical solutions of embodiments of the present disclosure, drawings used in description of the embodiments are briefly introduced hereinafter. Apparently, the described drawings merely illustrate a part of the disclosed embodiments. A person of ordinary skill in the art may obtain other drawings based on the described drawings without any creative efforts.

FIG. 2b is a schematic diagram showing positions of four structural units in FIG. 2a;

DETAILED DESCRIPTION

Hereinafter, the technical solutions in embodiments of the present disclosure are described clearly and completely in conjunction with drawings in the embodiments of the present disclosure. Apparently, the described embodiments are merely a part of embodiments of the present disclosure, rather than all the embodiments of the present disclosure. All other embodiments obtained by a person of ordinary skill in the art based on the described embodiments of the present disclosure, without creative efforts, shall fall within the scope of the present disclosure.

Figure 1A:
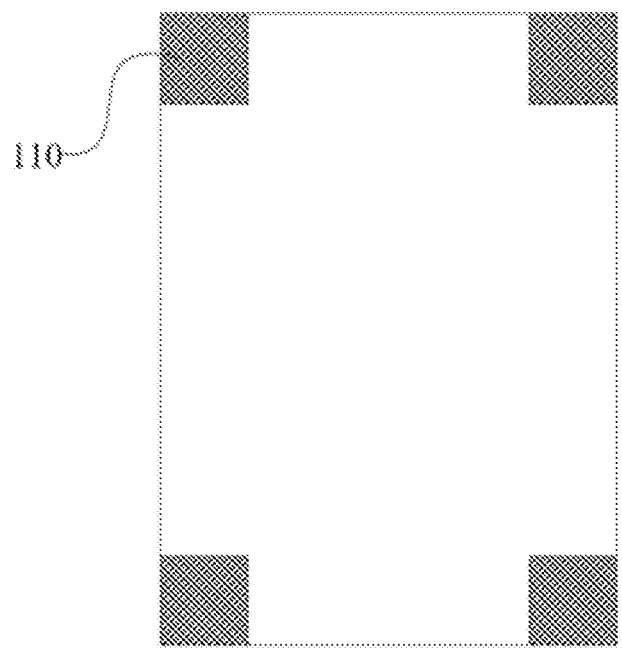
FIG. 1a is a schematic diagram showing positions of partial display regions in a rectangular display substrate.
Figure 1B:
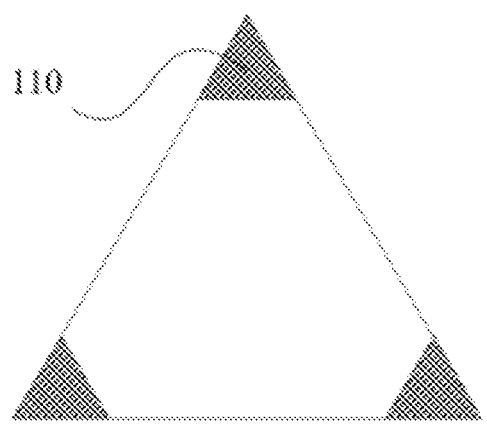
FIG. 1b is a schematic diagram showing positions of partial display regions in a triangular display substrate.
Figure 2A:
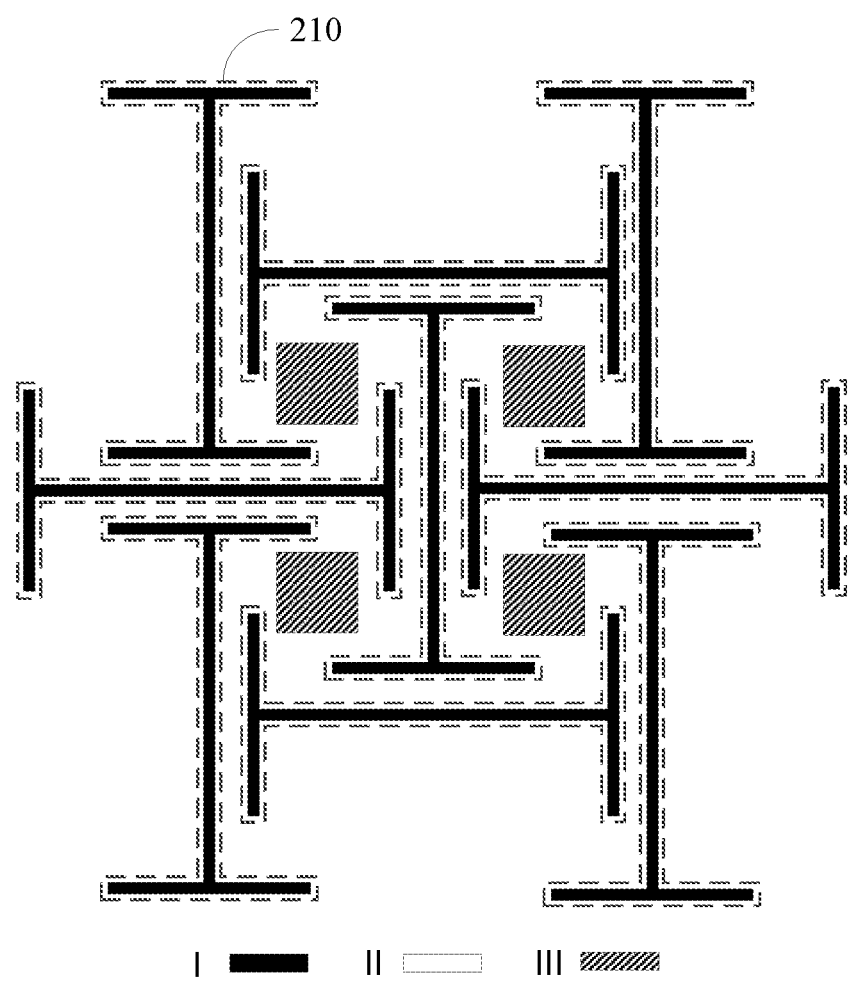
FIG. 2a is a schematic diagram showing positions of a hole-forming area, a bridge area and an island area included in a structural unit in a partial display region of a display substrate according to an embodiment of the present disclosure.
Figure 2B:
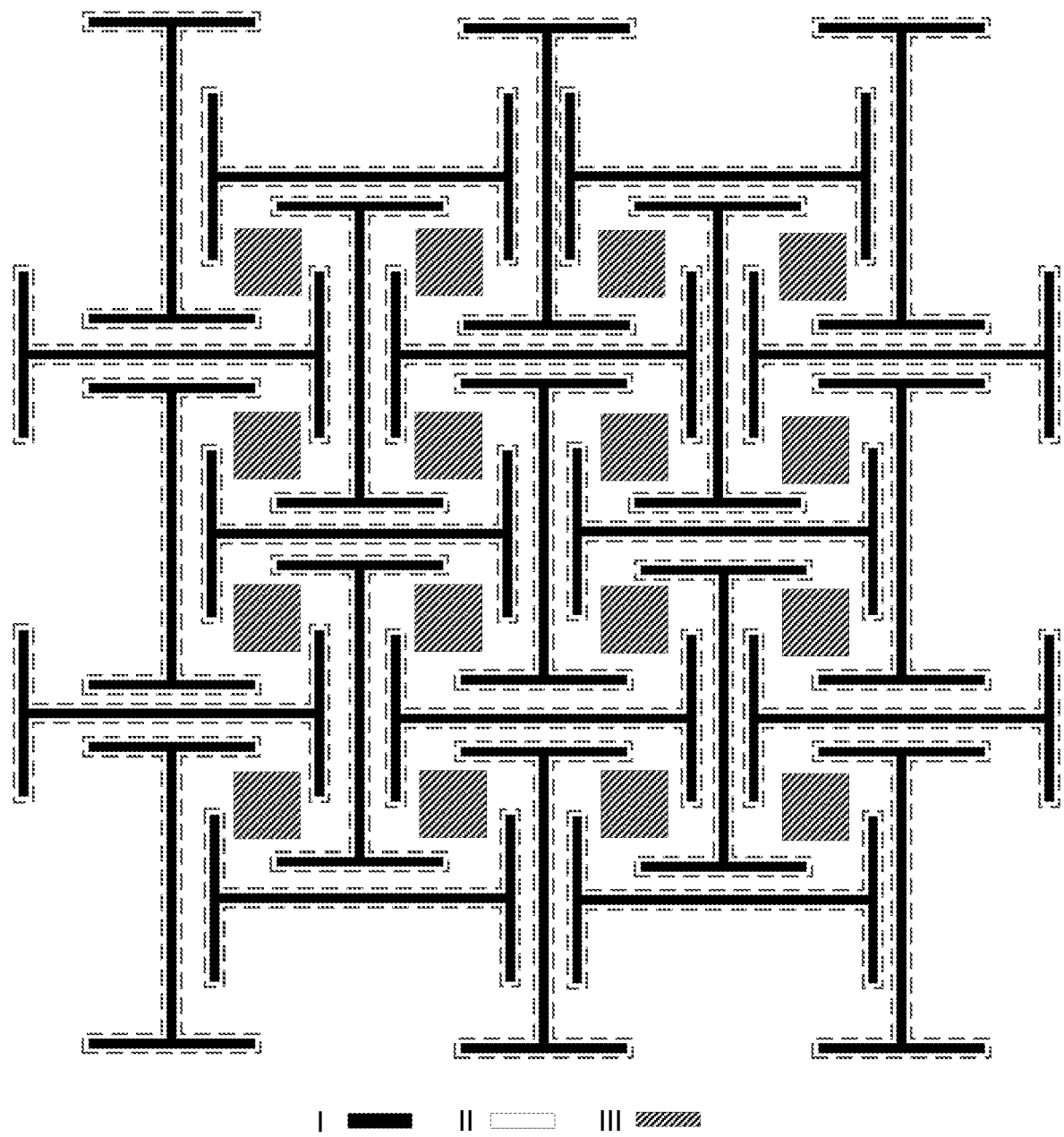

Embodiments of the present disclosure provide a display substrate, including a base film layer and a functional film layer. As shown in FIG. 1a and FIG. 1b, the display substrate includes a plurality of partial display regions. As shown in FIG. 2a and FIG. 2b, the partial display region is provided with a plurality of hole-forming areas, and the plurality of hole-forming areas divide an island area for displaying and a bridge area for signal transmission. The plurality of hole-forming areas are arranged around the island area. One part of the bridge area is located between the island area and the hole-forming area and the other part of the bridge area is located between the hole-forming areas. The display substrate further includes a separation structure located in the bridge area.

The separation structure is located on the base film layer for separating a target functional film layer to form a first part and a second part. The target function film layer includes any functional film layer formed at a side of the separation structure away from the base film layer, the first part includes a part of the target functional film layer that is located at a side of the separation structure away from the hole-forming area, and the second part includes a part of the target functional film layer that is located at a side of the separation structure near the hole-forming area.

In the embodiments of the present disclosure, since the separation structure is located in the bridge area, and because the bridge area is located between the hole-forming area and the island area, that is, the first part separated from the second part by the separation structure includes a part of the target functional film layer located in the island area, and the second part includes a part of the target functional film layer near the hole-forming area that is intruded by water and oxygen. By dividing the target functional film layer into two parts that are separated from each other, the water and oxygen in the second part can be prevented from intruding into the first part, that is, it can be ensured that water and oxygen cannot intrude the part of the target functional film layer located in the island area, thereby ensuring normal display of the display device. Therefore, the technical solution provided by the present disclosure can ensure normal display of the display device.

In the embodiments of the present disclosure, the shape of the display substrate is not limited. For example, when the display substrate is a rectangular display substrate, as shown in FIG. 1a, the rectangular display substrate may have four partial display regions 110, and each partial display region 110 is provided with a plurality of hole-forming areas I (as shown in FIG. 2a). The four partial display regions may be at four corner regions of the rectangular display substrate, as shown in FIG. 1a, or may also at four frame regions of a rectangular display substrate, or may also include two corner regions and two frame regions. For another example, when the display substrate is a triangular display substrate, as shown in FIG. 1B, the triangular display substrate has three partial display regions 110, and each partial display region 110 is provided with a plurality of hole-forming areas I. The three local display regions may be at three corner regions of the triangular display substrate, as shown in FIG. 1B.

In the embodiments of the present disclosure, a structural unit including the hole-forming area I, the bridge area II and the island area III in the partial display region 110 is shown in FIG. 2a. The hole-forming area I includes a via-hole that extends through the functional film layer and the base film layer; the bridge area II includes signal traces for signal transmission; and the island area III includes display components, which are electrically connected with the signal traces for light-emitting display. The hole-forming area I may be arranged in an "H"-shaped structure in the partial display region.

It should be noted that the hole-forming area I, the bridge area II and the island area III are repetitively arranged. FIG. 2a shows only one structural unit for repetitive arrangement; as shown in FIG. 2b, a plurality of structural units as shown in FIG. 2a may be repeatedly arranged in the partial display region, for example, there are 4 structural units repeatedly arranged.

The plurality of hole-forming areas I are openly arranged around the island area III. As shown in FIG. 2a, the island area III includes four directions, and four hole-forming areas I occupy parts in the four directions respectively, so that signal traces in the bridge area II can be electrically connected to the display components in the island area III. Optionally, the separation structure 210 is located in the bridge area II at a position near the hole-forming area I, and the separation structure 210 is represented by a dashed line in FIG. 2a and FIG. 2b.

The separation structure 210 is located in the bridge area II. Specifically, the separation structure 210 is located in the bridge area II between two hole-forming areas I, and is also located in the bridge area II between the hole-forming area I and the island area III. The separation structure 210 is shown by the dashed line in FIG. 2.

An outline of an orthographic projection of each separation structure 210 onto the base film layer is a closed pattern and is the same as a boundary pattern of the hole-forming area I, thereby ensuring that the separation structure 210 prevents water and oxygen from intruding the island area III from the hole-forming area I at each position.

The separation structure 210 is located on the base film layer for separating a target functional film layer to form a first part and a second part, and the target function film layer is any functional film layer formed at a side of the separation structure away from the base film layer, and the target functional film layer is a display film layer.

By dividing the target functional film into a first part and a second part that are separated from each other, when the second part near the hole-forming area I is intruded by water and oxygen, the first part located in the island area III will be not intruded by water and oxygen because the first part is separated from the second part, thereby ensuring the normal operation of the target functional film in the island area III and then ensuring the normal display of the display device.

Each separation structure 210 is a closed structure with a head thereof being connected to an end thereof. The separation structure 210 is arranged around the hole-forming area I.

In this embodiment, each separation structure 210 is a closed structure. By arranging the separation structure 210 around the hole-forming area I, it is possible to prevent the water and oxygen intruded from the hole-forming area I from passing through the separation structure 210 into the island area III, thereby ensuring the water and oxygen blocking effect of the island area III.

Further, N separation structures 210 are arranged around one hole-forming area, where N is equal to 1, 2 or 3.

Each hole-forming area I is surrounded by at least one separation structure 210 to prevent water and oxygen in the hole-forming area I from intruding the island area III. The greater the number of separation structures 210 that surround the hole-forming area I, the better the effect of preventing water and oxygen from intruding the island area III, but at the same time the larger the space of the bridge area II occupied by the separation structures 210. By designing the number of separation structures 210 surrounding one hole-forming area I to be 1, 2 or 3, the space occupied by the separation structures 210 in the bridge area II can be reduced while ensuring the water and oxygen blocking effect of the island area III.

At least two separation structures 210 surrounding an identical hole-forming area I have a same direction, i.e., having an identical contour shape, and a contour length is proportional to a distance from each separation structure 210 to the hole-forming area I. The at least two separation structures 210 surrounding the identical hole-forming area I are arranged being concentric with a center of the hole-forming area I.

Figure 3:
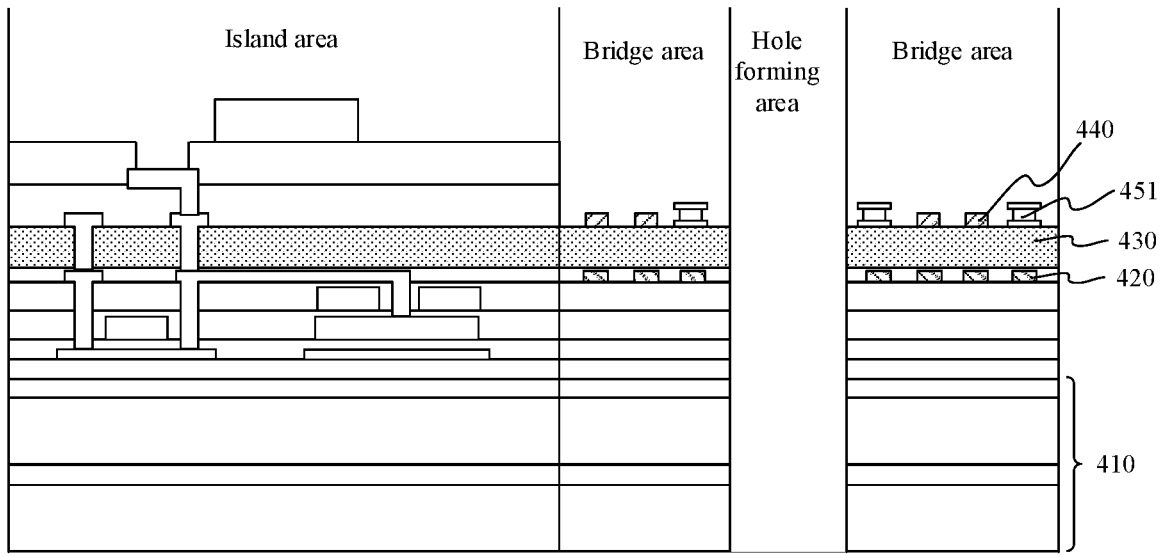
FIG. 3 is a schematic structural diagram of some film layers in a display substrate according to another embodiment of the present disclosure.
Figure 4:
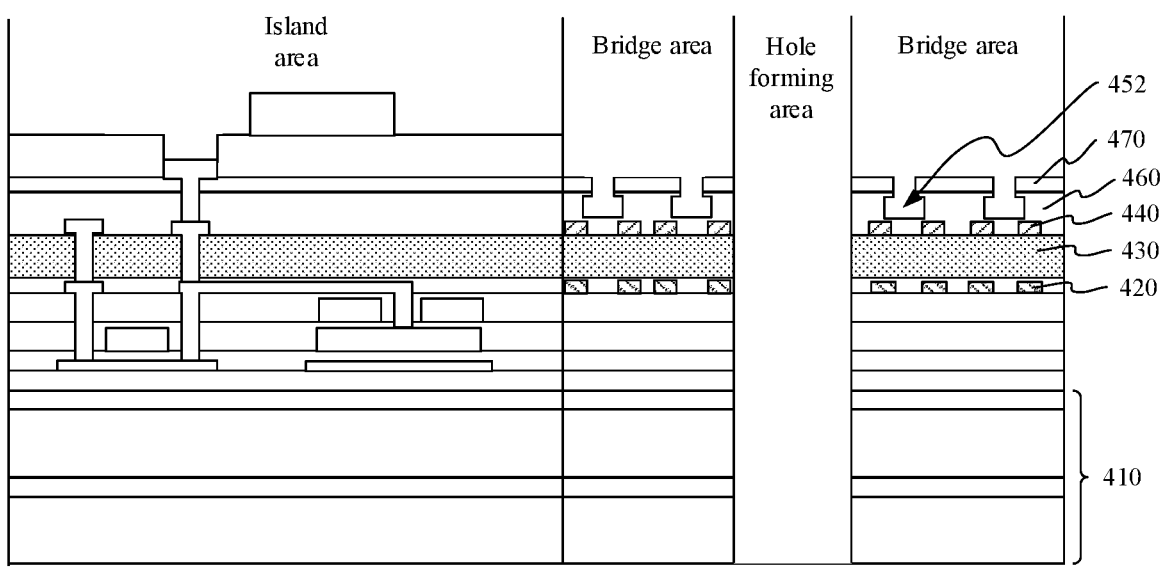
FIG. 4 is a schematic structural diagram of some film layers in a display substrate according to another embodiment of the present disclosure.

Further, as shown in FIG. 3 and FIG. 4, the bridge area II includes first-layer signal traces 420, a first planarization layer 430, and second-layer signal traces 440 that are sequentially arranged in a direction away from the base film layer 410. The first planarization layer 430 is located between the first-layer signal traces 420 and the second-layer signal traces 440. The number of the second-layer signal traces 440 is not greater than the number of the first-layer signal traces 420.

In this embodiment, the number of the first-layer signal traces 420 may be equal to or greater than the number of the second-layer signal traces 440.

The first-layer signal trace 420 and the second-layer signal trace 440 may be arranged directly opposite, that is, an orthographic projection of the first-layer signal trace 420 onto the base film layer 410 coincides with an orthographic projection of the second-layer signal trace 440 onto the base film layer 410. The first-layer signal trace 420 and the second-layer signal trace 440 may also be arranged in a staggered manner, that is, an orthographic projection of one first-layer signal trace 420 onto the base film layer is located between two orthographic projections of two adjacent the second-layer signal traces 440 onto the base film layer 410.

Signals transmitted by the first-layer signal trace 420 and the second-layer signal trace 440 may be the same or different. In a case that the signals transmitted by the first-layer signal trace 420 and the second-layer signal trace 440 are the same, the first-layer signal trace 420 and the second-layer signal trace 440 may be connected through a via-hole in the island area and/or the bridge area.

Further, the separation structure is located at a side of the first-layer signal trace 420 away from the base film layer 410.

That is to say, the separation structure will not occupy a layout space of the first-layer signal traces 420 in the bridge area II, but there may be a situation in which the separation structure may occupy a layout space of the second-layer signal traces 440 in the bridge area II, resulting in that the number of the second-layer signal traces 440 is smaller than the number of the first-layer signal traces 420.

In an optional implementation of the present disclosure, as shown in FIG. 3, the separation structure in the bridge area II is located on the first planarization layer 430 and between the second-layer signal traces 440 and the hole-forming area I, and the number of the first-layer signal traces 420 is greater than the number of the second-layer signal traces 440.

As shown in FIG. 3, the second-layer signal traces 440 and the separation structure are both arranged on the first planarization layer 430. Since the layout space in the bridge area II is limited, the layout of the separation structure reduces the layout space of the second-layer signal traces 440, so that the number of second-layer signal traces 440 is reduced, which is smaller than the number of first-layer signal traces 420 that has not reduced in layout space.

Figure 5:
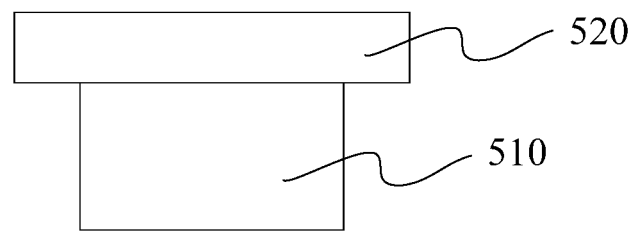
FIG. 5 is a schematic structural diagram of a separation column in a display substrate according to another embodiment of the present disclosure.

Further, the separation structure includes a separation column 451, as shown in FIG. 5, the separation column includes a first structure 510 and a second structure 520 arranged in a direction perpendicular to the base film layer. The first structure 510 is located between the second structure 520 and the base film layer 410. An orthographic projection of the first structure 510 onto the base film layer 410 is located inside an orthographic projection of the second structure 520 onto the base film layer 410.

Figure 6:
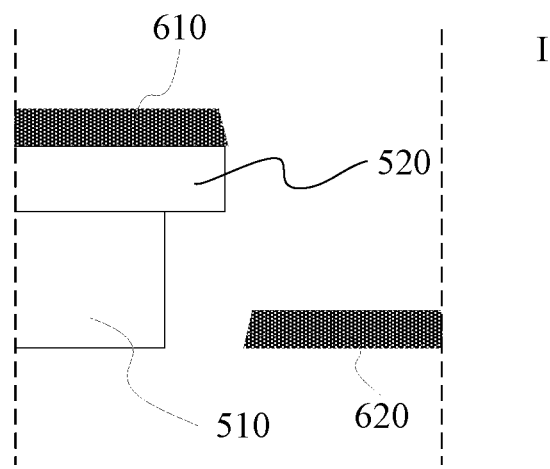
FIG. 6 is a schematic diagram of the separation column shown in FIG. 5 separating a target functional film layer.

After the separation column is formed on the first flat layer 430, a target functional film layer subsequently formed at a side of the separation column away from the substrate film layer 410 will be divided into a first part 610 and a second part 620 separated with each other, as shown in FIG. 6. The first part 610 includes a part of the target functional film layer located at a side of the separation structure away from the hole-forming area I, and the second part 620 includes a part of the target functional film layer located at a side of the separation structure close to the hole-forming area I. In this way, when water and oxygen intrude the second part 620 of the target functional film layer, the water and oxygen will not intrude into the first part 610 through the second part 620, so that functionality of the first part 610 of the target functional film layer will not be damaged, thereby ensuring normal display of the island area.

It should be noted that the separation column 451 is not limited to the first structure 510 and the second structure 520, but may further include a third structure 530. The third structure 530 may located at a side of the first structure 510 away from the second structure 520, so that the separation column 451 has an "H"-shaped structure. At this point, the first structure 510 and the second structure 520 of the separation column can also divide the target functional film layer into the first part 610 and the second part 620 that are separated with each other, thereby preventing water and oxygen from intruding the first part 610 from the second part 620.

Further, materials of the separation column 451 and the second-layer signal traces 440 are the same.

The separation column 451 and the second-layer signal traces 440 are both located on the first planarization layer 430, and since the materials of the separation column 451 and the second-layer signal traces 440 are the same, the separation column 451 and the second-layer signal traces 440 can be simultaneously manufactured on the first planarization layer when manufacturing the display substrate, thereby improving a manufacturing efficiency of the display substrate.

In another optional implementation of the present disclosure, as shown in FIG. 4, the bridge area II further includes a second planarization layer 460 covering the second-layer signal traces 440, and the separation structure is located at a side of the second-layer signal traces 440 away from the base film layer 410. The number of the first-layer signal traces 420 is equal to the number of the second-layer signal traces 440.

Since the separation structure is located at the side of the second-layer signal traces 440 away from the base film layer 410, that is, the separation structure does not affect the layout space of the second-layer signal traces 440, and thus the second-layer signal traces 440 and the first-layer signal traces 420 have the same layout space, and then the second-layer signal traces 440 and the first-layer signal traces 420 have the same number of traces.

In this embodiment, since the separation structure does not affect the layout space of the first-layer signal traces 420 and the second-layer signal traces 440, intervals between the signal traces in the bridge area II under the same number of traces can be larger, that is, density of traces is reduced, thereby avoiding crosstalk between adjacent traces, and increasing reliability of the traces of the high pixel density (PPI) display device in the bridge area II.

Further, the bridge area II further includes a passivation layer 470 arranged on the second planarization layer 460, and the separation structure includes an separation groove 452 that extends through the passivation layer 470 and a part of the second planarization layer 460. An orthographic projection of an opening of the separation groove 452 onto the base film layer 410 is located inside an orthographic projection of the separation groove 452 onto the base film layer 410.

In this embodiment, the passivation layer 470 is an inorganic layer, which can prevent the water and oxygen at a side close to the base film layer 410 from directly penetrating through the passivation layer 470 and intruding the functional film layer at a side of the passivation layer 470 away from the base film layer 410.

In this embodiment, a part of the second planarization layer 460 close to the base film layer 410 is used to cover the second-layer signal traces 440, and the other part of the second planarization layer 460 is used to form the separation groove 452 together with the passivation layer 470.

Figure 7:
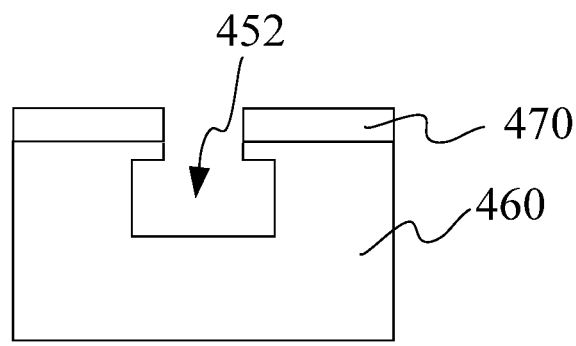
FIG. 7 is a schematic structural diagram of a separation groove in a display substrate according to another embodiment of the present disclosure.

As shown in FIG. 7, a size of the opening of the separation groove 452 in a transverse direction of a paper where FIG. 7 is located, is smaller than a distance between two oppositely arranged groove walls of the separation groove 452 in the transverse direction of a paper where FIG. 7 is located. The opening of the separation groove 452 is an opening in a face of the passivation layer 470 away from the base film layer 410.

An orthographic projection of a via-hole that extends through the passivation layer 470 onto the substrate film layer 410, coincides with an orthographic projection of one of the separation grooves formed in the second planarization layer 460 onto the substrate film layer 410.

Figure 8:
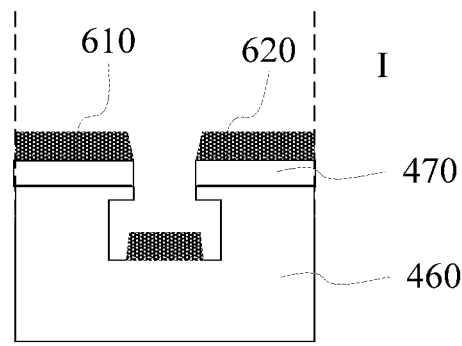
FIG. 8 is a schematic diagram of the separation groove shown in FIG. 7 separating a target functional film layer.

After the second planarization layer 460 and the passivation layer 470 together form the separation groove 452, a target functional film layer subsequently formed at a side of the separation groove 452 away from the base film layer 410 will be divided into a first part 610 and a second part 620 that are separated with each other at the opening, as shown in FIG. 8. The first part 610 includes a part of the target functional film layer that is located at a side of the separation groove away from the hole-forming area I. The second part 620 includes a part of the target functional film layer that is located at a side of the separation groove near the hole-forming area I. In this way, when water and oxygen intrude the second part 620 of the target functional film layer, the water and oxygen will not intrude into the first part 610 through the second part 620, so that the functionality of the first part 610 of the target functional film layer will not be damaged, thereby ensuring normal display of the island area III.

Further, an orthographic projection of the second-layer signal trace 440 onto the base film layer 410 does not coincide with the orthographic projection of the opening onto the base film layer 410.

By designing the second-layer signal traces 440 and the opening in a staggered manner, it is possible to avoid damaging the second-layer signal traces 440 due to excessive etching in the process of forming the separation groove 452, thereby improving the reliability and process yield of the display substrate.

In a high PPI display device, when there are many traces in the bridge area II, an orthographic projection of one separation groove 452 onto the base film layer 410 may partially overlap each of two orthographic projections of two adjacent second-layer signal traces onto the base film layer 410.

One embodiment of the present disclosure further provides a display device which includes the foregoing display substrate.

The display device may be a monitor, a mobile phone, a tablet computer, a television, a wearable electronic device, a navigation display device, etc.

One embodiment of the present disclosure further provides a method of manufacturing a display substrate, which includes:

providing a flexible base film layer, where the flexible base film layer includes a plurality of hole-forming areas defined in a partial display region, and the plurality of hole-forming areas divide an island area for displaying and a bridge area for signal transmission, the plurality of hole-forming areas are arranged around the island area, a part of the bridge area is located between the island area and the hole-forming area, and the other part of the bridge area is located between the hole-forming areas;

forming a separation structure on the flexible base film layer, where the separation structure is located in the bridge area;

forming a target functional film layer covering the separation structure, where the separation structure separates the target functional film layer to form a first part and a second part that are separated with each other, the first part includes a part of the target functional film layer that is located at a side of the separation structure away from the hole-forming area, and the second part includes a part of the target functional film layer that is located at a side of the separation structure near the hole-forming area.

In the embodiments of the present disclosure, since the separation structure is located in the bridge area, and because the bridge area is located between the hole-forming area and the island area, that is, the first part separated from the second part by the separation structure includes a part of the target functional film layer located in the island area, and the second part includes a part of the target functional film layer near the hole-forming area that is easily intruded by water and oxygen. By dividing the target functional film layer into two parts that are separated from each other, the water and oxygen in the second part can be prevented from intruding into the first part, thereby ensuring that water and oxygen cannot intrude the part of the target functional film layer located in the island area, and then ensuring normal display of the display device. Therefore, the technical solution provided by the present disclosure can ensure normal display of the display device.

In the embodiments of the present disclosure, the shape of the display substrate is not limited. For example, when the display substrate is a rectangular display substrate, as shown in FIG. 1a, the rectangular display substrate may have four partial display regions 110, and each partial display region 110 is provided with a plurality of hole-forming areas I (as shown in FIG. 2a). The four partial display regions may be at four corner regions of the rectangular display substrate, as shown in FIG. 1a, or may also at four frame regions of a rectangular display substrate, or may also include two corner regions and two frame regions. For another example, when the display substrate is a triangular display substrate, as shown in FIG. 1b, the triangular display substrate has three partial display regions 110, and each partial display region 110 is provided with a plurality of hole-forming areas I. The three local display regions may be at three corner regions of the triangular display substrate, as shown in FIG. 1b.

In the embodiments of the present disclosure, a structural unit including the hole-forming area I, the bridge area II and the island area III in the partial display region 110 is shown in FIG. 2a. The hole-forming area I includes a via-hole that extends through the functional film layer and the base film layer; the bridge area II includes signal traces for signal transmission; and the island area III includes display components, which are electrically connected with the signal traces for light-emitting display. The hole-forming area I may be arranged in an "H"-shaped structure in the partial display region.

It should be noted that the hole-forming area I, the bridge area II and the island area III are repetitively arranged. FIG. 2a shows only one structural unit for repetitive arrangement; as shown in FIG. 2b, a plurality of structural units as shown in FIG. 2a may be repeatedly arranged in the partial display region.

The plurality of hole-forming areas I are openly arranged around the island area III. As shown in FIG. 2a, the island area III includes four directions, and four hole-forming areas I occupy parts in the four directions respectively, so that signal traces in the bridge area II can be electrically connected to the display components in the island area III. Optionally, the separation structure 210 is located in the bridge area II at a position near the hole-forming area I.

The separation structure 210 is located in the bridge area II. Specifically, the separation structure 210 is located in the bridge area II between two hole-forming areas I, and is also located in the bridge area II between the hole-forming area I and the island area III. The separation structure 210 is shown by the dashed line in FIG. 2.

An outline of an orthographic projection of each separation structure 210 onto the base film layer is a closed pattern and is the same as a boundary pattern of the hole-forming area I, thereby ensuring that the separation structure 210 prevents water and oxygen from intruding the island area III from the hole-forming area I at each position.

The separation structure 210 is located on the base film layer for separating a target functional film layer to form a first part and a second part, and the target function film layer is any functional film layer formed at a side of the separation structure away from the base film layer, and the target functional film layer is a display film layer.

By dividing the target functional film into a first part and a second part that are separated from each other, when the second part near the hole-forming area I is intruded by water and oxygen, the first part located in the island area III will be not intruded by water and oxygen because the first part is separated from the second part, thereby ensuring the normal operation of the target functional film in the island area III and then ensuring the normal display of the display device.

Each separation structure 210 is a closed structure with a head thereof being connected to an end thereof. The separation structure 210 is arranged around the hole-forming area I.

In this embodiment, each separation structure 210 is a closed structure. By arranging the separation structure 210 around the hole-forming area I, it is possible to prevent the water and oxygen intruded from the hole-forming area I from passing through the separation structure 210 into the island area III, thereby ensuring the water and oxygen blocking effect of the island area III.

Each hole-forming area I is surrounded by at least one separation structure 210 to prevent water and oxygen in the hole-forming area I from intruding the island area III. The greater the number of separation structures 210 that surround the hole-forming area I, the better the effect of preventing water and oxygen from intruding the island area III, but at the same time the larger the space of the bridge area II occupied by the separation structures 210. By designing the number of separation structures 210 surrounding one hole-forming area I to be 1, 2 or 3, the space occupied by the separation structures 210 in the bridge area II can be reduced while ensuring the water and oxygen blocking effect of the island area III.

At least two separation structures 210 surrounding an identical hole-forming area I have a same direction, i.e., having an identical contour shape, and a contour length is proportional to a distance from each separation structure 210 to the hole-forming area I. The at least two separation structures 210 surrounding the identical hole-forming area I are arranged being concentric with a center of the hole-forming area I.

In an optional implementation of the present disclosure, the step of forming the separation structure on the flexible base film layer includes:

forming first-layer signal traces and a planarization layer covering the first-layer signal traces on the flexible base film layer;

simultaneously forming a first metal pattern and a second metal pattern in the bridge area on the first planarization layer, where the second metal pattern is located between the first metal pattern and the hole-forming area, each metal pattern includes a first metal layer and a second metal layer arranged in a direction perpendicular to the flexible base film layer, and the first metal layer is located between the second metal layer and the flexible base film layer;

forming an anode material layer on the flexible base film layer;

etching the second metal pattern to form an separation column while etching the anode material layer to obtain an anode, where an etching speed of the first metal layer is greater than an etching speed of the second metal layer.

In this embodiment, the separation structure is a separation column, and structure and material of the separation column are the same as structure and material of the second-layer signal traces.

The second metal pattern is a metal pattern for preparing the separation column, and the first metal pattern is a metal pattern for preparing the second-layer signal traces. After the first planarization layer is fabricated, the first metal pattern and the second metal pattern can be simultaneously formed on the first planarization layer through a patterning process.

Each of the first metal pattern and the second metal pattern includes a first metal layer and a second metal layer arranged in a direction perpendicular to the flexible base film layer, and the first metal layer is located between the second metal layer and the flexible base film layer. Under a same etching condition, a metal material with a high etching speed is selected as the first metal layer, and a metal material with a low etching speed is selected as the second metal layer. For example, metal aluminum is used as the first metal layer, and metal titanium is used as the second metal layer.

After the first metal pattern and the second metal pattern are formed, an anode material layer is formed, and the second metal layer is etched to obtain the separation column in the process of obtaining the anode material layer by etching. As shown in FIG. 5, the first structure 510 of the separation column 451 is a portion of the first metal layer after etching, and the second structure 520 is s portion of the second metal layer after etching.

It should be noted that after the first metal pattern and the second metal pattern are formed and before the anode material is formed, there may also be a step of forming other functional film layers. These formed functional film layers are not retained in the bridge area after patterning, and thus, the anode material formed subsequently can cover the first metal pattern and the second metal pattern, for example, a second planarization layer is formed in the island area.

A target functional film layer subsequently formed at a side of the separation column away from the substrate film layer 410 will be divided, at the second structure 520, into a first part 610 and a second part 620 separated with each other, as shown in FIG. 6. The first part 610 includes a part of the target functional film layer located at a side of the separation structure away from the hole-forming area I, and the second part 620 includes a part of the target functional film layer located at a side of the separation structure close to the hole-forming area I. In this way, when water and oxygen intrude the second part 620 of the target functional film layer, the water and oxygen will not intrude into the first part 610 through the second part 620, so that functionality of the first part 610 of the target functional film layer will not be damaged, thereby ensuring normal display of the island area.

The step of etching the second metal pattern to form an separation column while etching the anode material layer to obtain an anode, includes:

while etching the anode material layer in the island area with a first etching solution to obtain an anode, etching a part of the anode material layer covering the second metal pattern and reserving a part of the anode material layer covering the first metal pattern;

etching the second metal pattern with a second etching solution to form a separation structure.

In this embodiment, first, an entire layer of the anode material layer is coated with photoresist, and the photoresist is covered by a mask with a light-transmitting area corresponding to the anode and the first metal pattern, and a photoresist pattern is obtained after exposure. An orthographic projection of the photoresist onto the base film layer coincides with an orthographic projection of the anode onto the base film layer and an orthographic projection of the first metal pattern onto the base film layer.

Figure 9:
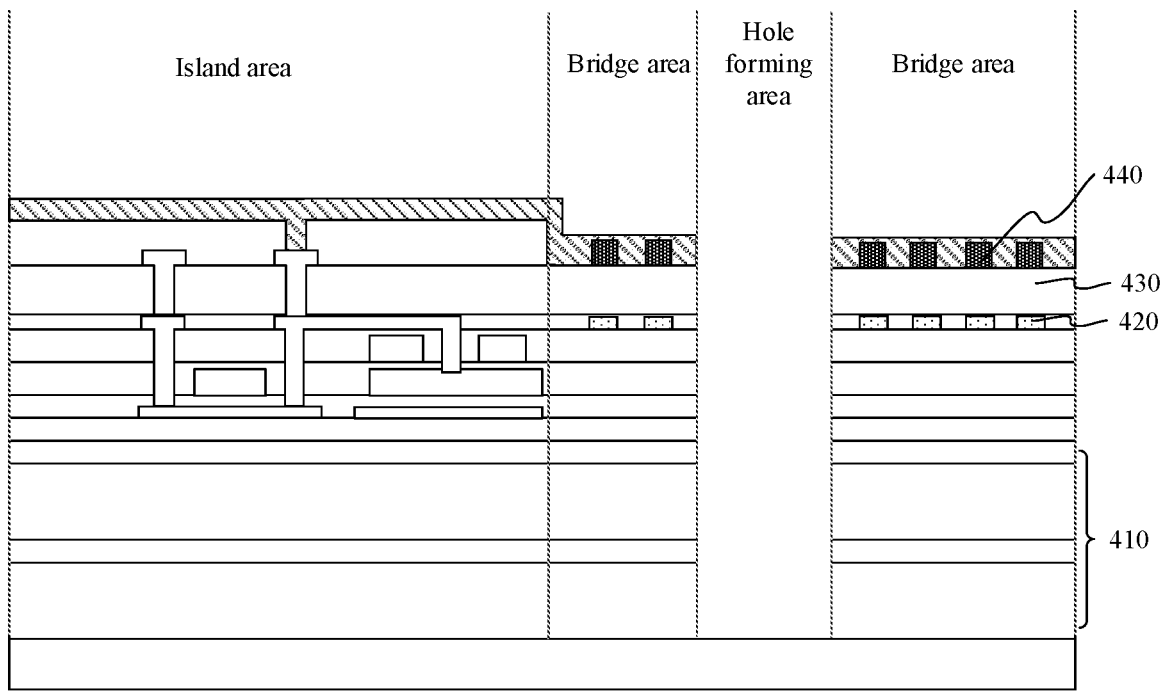
FIG. 9 is a schematic diagram of a structure after forming an anode material layer in a method of manufacturing a display substrate according to an embodiment of the present disclosure.

Then, the first etching solution is used for development, while etching a part of the anode material in the island area to obtain the anode, the part of the anode material in the bridge area covering the second metal pattern is etched to expose the second metal pattern, but the part of the anode material covering the first metal pattern is not etched, so that the anode material protects the first metal pattern, as shown in FIG. 9.

Figure 10:
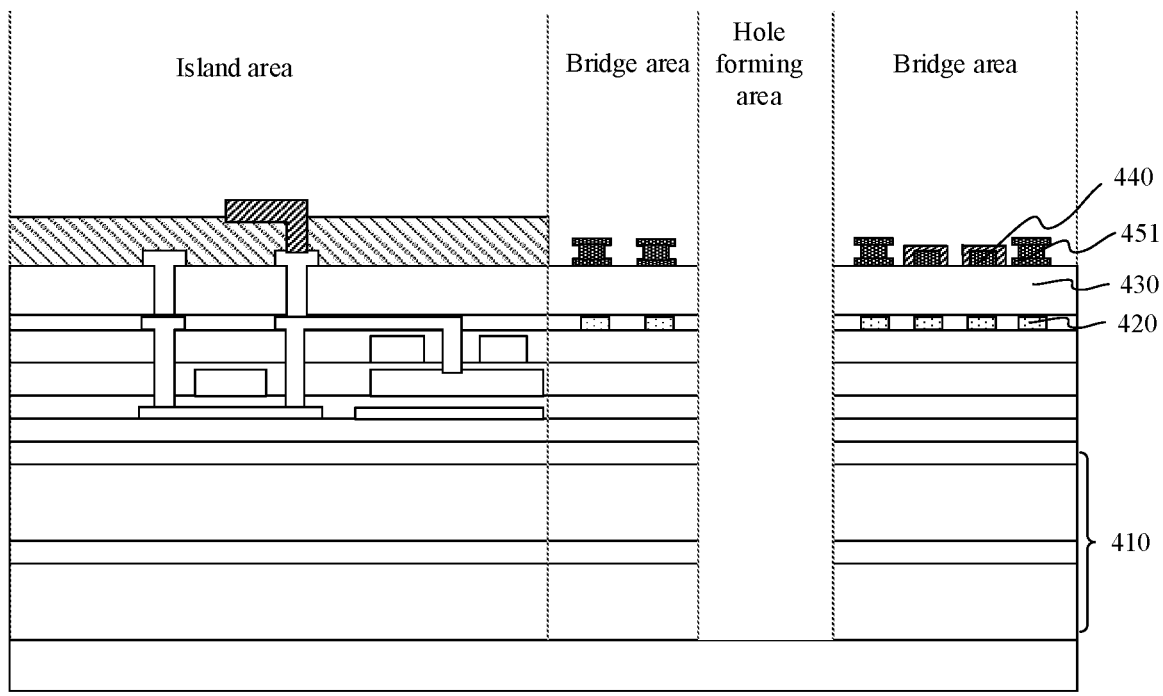
FIG. 10 is a schematic diagram of a structure after forming a separation column in a method of manufacturing a display substrate according to another embodiment of the present disclosure.

After that, the second etching solution is used to etch the exposed second metal pattern. The second etching solution cannot etch the anode material, so the first metal pattern protected by the anode material will not be etched by the second etching solution, so that the second metal pattern forms a separation column, as shown in FIG. 10. Afterwards, the anode material covering the first metal pattern is removed.

In this way, it can be ensured that when the second metal pattern is etched to form the separation column, the first metal pattern is prevented from being etched, and the production yield of the second-layer signal traces can be ensured.

In another optionally embodiment of the present disclosure, the step of forming the separation structure on the flexible base film layer, includes:

sequentially forming first-layer signal traces, a first planarization layer covering the first-layer signal traces, the second-layer signal trace, a second planarization layer covering the second-layer signal traces and a passivation layer on the flexible base film layer;

etching the passivation layer to form a via-hole that extends through the passivation layer in the bridge area;

taking the etched passivation layer as a mask, etching a part of the second planarization layer to form a groove in the second planarization layer in the bridge area, so that the via-hole and the groove together form a separation groove, where an orthographic projection of an opening of the separation groove onto the flexible base film layer is located inside an orthographic projection of the separation groove onto the flexible base film layer.

In this embodiment, the separation structure is a separation groove that extends through the passivation layer and a part of the second planarization layer.

First, after the passivation layer is formed, a photoresist is coated on the passivation layer and then is exposed, and then a via-hole that extends through the passivation layer, is formed by development.

Figure 11:
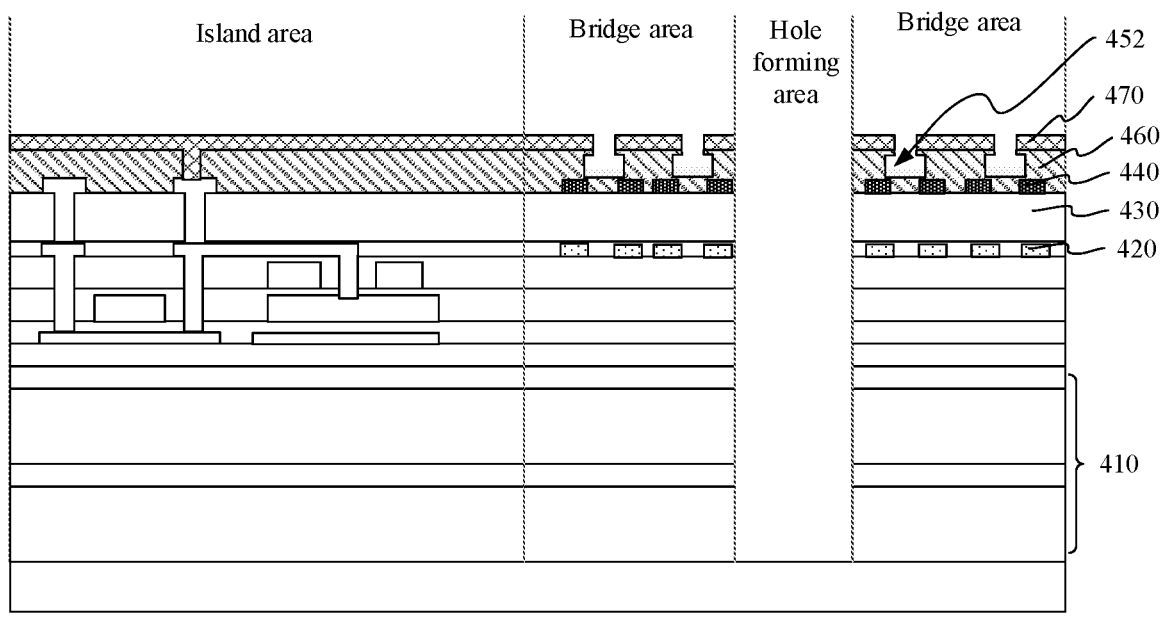
FIG. 11 is a schematic diagram of a structure after forming a separation groove in a method of manufacturing a display substrate according to another embodiment of the present disclosure.

After that, taking the passivation layer with the via-hole as a mask, a part of the second planarization layer is dry etched to form a groove in the second planarization layer, as shown in FIG. 11. A size of an opening in the groove can be adjusted by controlling the time of dry etching.

Figure 12:
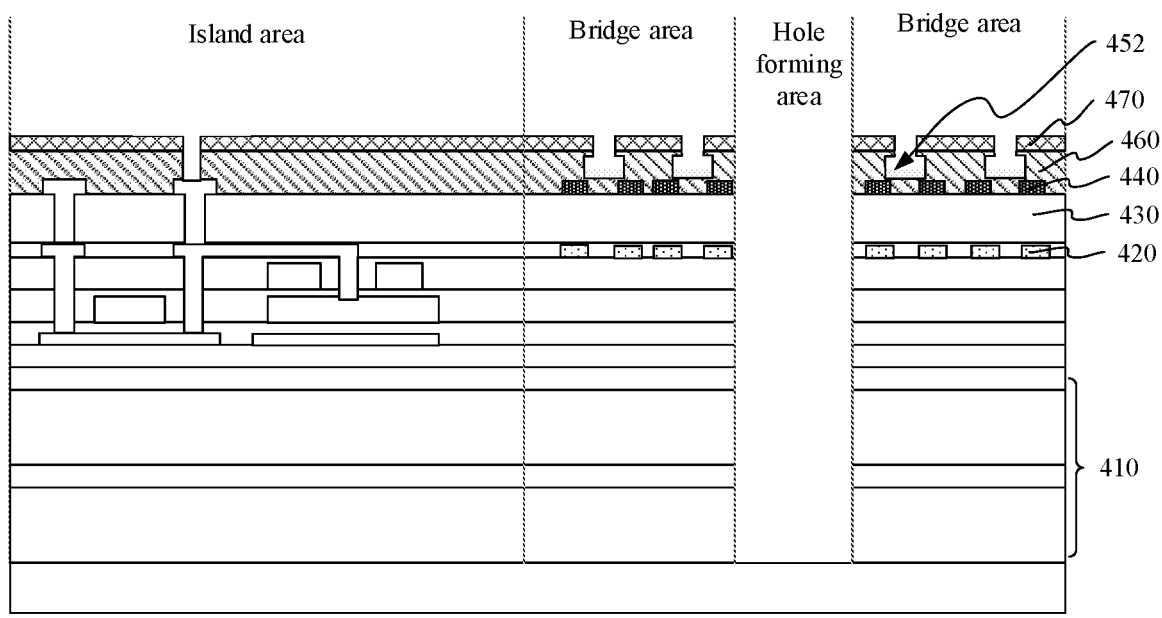
FIG. 12 is a schematic diagram of a structure after patterning a passivation layer in a method of manufacturing a display substrate according to another embodiment of the present disclosure.

After the separation groove is formed and the fabrication of the via-hole is completed, the passivation layer is patterned, as shown in FIG. 12.

In this embodiment, the opening of the separation groove is an opening in a side of the passivation layer away from the substrate film layer, that is, an end of the via-hole defined in the passivation layer away from the base film layer.

The target functional film layer subsequently formed at the side of the separation groove 452 away from the base film layer 410 will be divided into a first part 610 and a second part 620 that are separated with each other at the opening, as shown in FIG. 8. The first part 610 includes a part of the target functional film layer that is located at a side of the separation groove 452 away from the hole-forming area I, and the second part 620 includes a part of the target functional film layer that is located at a side of the separation structure near the hole-forming area I. In this way, when water and oxygen intrude the second part 620 of the target functional film layer, the water and oxygen will not intrude into the first part 610 through the second part 620, so that the functionality of the first part 610 of the target functional film layer will not be damaged, thereby ensuring normal display of the island area III.

Unless otherwise defined, the technical or scientific terms used in the present disclosure shall have the ordinary meanings understood by those of ordinary skill in the art to which the present disclosure belongs. The terms "first", "second", and the like used in this disclosure do not indicate any order, quantity, or priority, but are only used to distinguish different components. The terms "include", "have" or any variations thereof are intended to mean that an element or article followed by such a term encompasses a list of elements or articles preceded by such a term, or equivalents thereof, without precluding other elements or articles. Expressions such as "connection" or "connected" are not limited to physical or mechanical connections, but may include electrical connections, whether direct or indirect. Such words as "on", "under", "left" and "right" are merely used to represent relative position relationship, and when an absolute position of the object is changed, the relative position relationship will be changed too.

It will be understood that when an element, such as a layer, film, area or substrate, is referred to as being "on" or "under" another element, it can be directly on or directly under the other element, or intervening elements may also be present.

The embodiments of the present disclosure have been described above with reference to the drawings, but the present disclosure is not limited to the above-mentioned specific embodiments. The above-mentioned specific embodiments are only illustrative and not restrictive. Under the teaching of the present disclosure, a person skilled in the art may make various modifications without departing from the principle of the present disclosure and the protection scope of the claims, which shall also fall within the scope of the present disclosure.

What is claimed is:

1. A display substrate, comprising: a base film layer, a functional film layer, and a partial display region; wherein the partial display region includes a plurality of hole-forming areas, an island area for displaying and a bridge area for signal transmission, the island area and the bridge area are divided by the plurality of hole-forming areas; the plurality of hole-forming areas are arranged around the island area, a part of the bridge area is located between the island area and the plurality of hole-forming areas and the other part of the bridge area is located between the plurality of hole-forming areas; the display substrate further includes a separation structure located in the bridge area;
   wherein the separation structure is located on the base film layer and separates a target functional film layer to form a first part and a second part, and the target function film layer includes any functional film layer formed at a side of the separation structure away from the base film layer, the first part includes a part of the target functional film layer that is located at a side of the separation structure away from the plurality of hole-forming areas, and the second part includes a part of the target functional film layer that is located at a side of the separation structure near the plurality of hole-forming areas;
   wherein each hole-forming area has a shape of "H", and includes a first opening portion and two second opening portions at two sides of the first opening portion and communicating with the first opening portion;
   in the plurality of hole-forming areas surrounding the same island area, the first hole forming portions in two adjacent hole-forming areas are perpendicular to each other.

2. The display substrate according to claim 1, wherein each separation structure is a closed structure with a head thereof being connected to an end thereof; and the separation structure is arranged around one of the plurality of hole-forming areas.

3. The display substrate according to claim 2, wherein there are N separation structures that are arranged around the same hole-forming area of the plurality of hole-forming areas, and N is equal to 1, 2 or 3.

4. The display substrate according to claim 1, wherein the bridge area includes first-layer signal traces, a first planarization layer and second-layer signal traces that are sequentially arranged in a direction away from the base film layer; and the first planarization layer is located between the first-layer signal traces and the second-layer signal traces; and the number of the second-layer signal traces is not greater than the number of first-layer signal traces.

5. The display substrate according to claim 4, wherein the separation structure is located at a side of the first-layer signal traces away from the base film layer.

6. The display substrate according to claim 5, wherein the separation structure in the bridge area is located on the first planarization layer and between the second-layer signal traces and the plurality of hole-forming areas, and the number of the first-layer signal traces is greater than the number of the second-layer signal traces.

7. The display substrate according to claim 6, wherein the separation structure includes a separation column; the separation column includes a first structure and a second structure arranged in a direction perpendicular to the base film layer; the first structure is located between the second structure and the base film layer; an orthographic projection of the first structure onto the base film layer is located inside an orthographic projection of the second structure onto the base film layer.

8. The display substrate according to claim 7, wherein the separation column and the second-layer signal traces are made of the same material.

9. The display substrate according to claim 5, wherein the bridge area further includes a second planarization layer covering the second-layer signal traces; the separation structure is located at a side of the second-layer signal traces away from the base film layer; and the number of the first-layer signal traces is equal to the number of the second-layer signal traces.

10. The display substrate according to claim 9, wherein the bridge area further includes a passivation layer arranged on the second planarization layer; the separation structure includes a separation groove that extends through the passivation layer and a part of the second planarization layer; and an orthographic projection of an opening of the separation groove onto the base film layer is located inside an orthographic projection of the separation groove onto the base film layer.

11. The display substrate according to claim 10, wherein an orthographic projection of the second-layer signal traces onto the base film layer does not coincide with the orthographic projection of the opening of the separation groove onto the base film layer.

12. The display substrate according to claim 11, wherein an orthographic projection of one separation groove onto the base film layer partially overlaps each of two orthographic projections of two adjacent second-layer signal traces onto the base film layer.

13. The display substrate according to claim 1, wherein the display substrate is a rectangular display substrate, and there are four partial display regions at four corner regions of the rectangular display substrate.

14. The display substrate according to claim 1, wherein in each hole-forming area, the second opening portion is perpendicular to the first opening portion.

15. The display substrate according to claim 1, wherein between the two second opening portions in each hole-forming area, there are two island areas arranged at intervals along an extension direction of the first opening portion.

16. A display device, comprising: the display substrate according to claim 1.

17. A method of manufacturing a display substrate, comprising:
   providing a flexible base film layer, wherein the flexible base film layer includes a plurality of hole-forming areas defined in a partial display region, and the plurality of hole-forming areas divide an island area for displaying and a bridge area for signal transmission, the plurality of hole-forming areas are arranged around the island area, a part of the bridge area is located between the island area and the plurality of hole-forming areas and the other part of the bridge area is located between the plurality of hole-forming areas;
   forming a separation structure on the flexible base film layer, wherein the separation structure is located in the bridge area;
   forming a target functional film layer covering the separation structure, wherein the separation structure separates the target functional film layer to form a first part and a second part that are separated with each other, the first part includes a part of the target functional film layer that is located at a side of the separation structure away from the plurality of hole-forming areas, and the second part includes a part of the target functional film layer that is located at a side of the separation structure near the plurality of hole-forming areas;
   wherein each hole-forming area has a shape of "H", and includes a first opening portion and two second opening portions at two sides of the first opening portion and communicating with the first opening portion; in the plurality of hole-forming areas surrounding the same island area, the first hole forming portions in two adjacent hole-forming areas are perpendicular to each other.

18. The method according to claim 17, wherein the step of forming the separation structure on the flexible base film layer, includes:
   forming first-layer signal traces on the flexible base film layer and a planarization layer covering the first-layer signal traces;
   simultaneously forming a first metal pattern and a second metal pattern in the bridge area on the first planarization layer, wherein the second metal pattern is located between the first metal pattern and the plurality of hole-forming areas, each of the first metal pattern and the second metal pattern includes a first metal layer and a second metal layer arranged in a direction perpendicular to the flexible base film layer, and the first metal layer is located between the second metal layer and the flexible base film layer;
   forming an anode material layer on the flexible base film layer;
   etching the second metal pattern to form an separation column while etching the anode material layer to obtain an anode, wherein an etching speed of the first metal layer is greater than an etching speed of the second metal layer.

19. The method according to claim 18, wherein the step of etching the second metal pattern to form a separation column while etching the anode material layer to obtain an anode, includes:
   when etching the anode material layer in the island area with a first etching solution to obtain an anode, etching a part of the anode material layer covering the second metal pattern with a part of the anode material layer covering the first metal pattern being reserved;
   etching the second metal pattern with a second etching solution to form the separation structure.

* * * * *